United States Patent
Honda et al.

(10) Patent No.: US 8,293,655 B2
(45) Date of Patent: Oct. 23, 2012

(54) DRY ETCHING METHOD

(75) Inventors: Masanobu Honda, Nirasaki (JP);
Shoichiro Matsuyama, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 388 days.

(21) Appl. No.: 12/558,379

(22) Filed: Sep. 11, 2009

(65) Prior Publication Data

US 2010/0062607 A1   Mar. 11, 2010

(30) Foreign Application Priority Data

Sep. 11, 2008   (JP) .................. 2008-233888

(51) Int. Cl.
*H01L 21/302* (2006.01)

(52) U.S. Cl. ........... 438/714; 438/706; 438/710; 216/61

(58) Field of Classification Search ................ 438/706, 438/710, 712, 714, 720, 10; 156/345.47, 156/48, 345, 44, 45
See application file for complete search history.

(56) References Cited

U.S. PATENT DOCUMENTS

| 4,341,593 | A | * | 7/1982 | Kurisaki et al. | 438/720 |
| 5,609,737 | A | * | 3/1997 | Fukui et al. | 204/192.12 |
| 5,660,671 | A | * | 8/1997 | Harada et al. | 156/345.46 |
| 7,688,619 | B2 | * | 3/2010 | Lung et al. | 365/163 |
| 2005/0167263 | A1 | * | 8/2005 | Chistyakov | 204/192.12 |

FOREIGN PATENT DOCUMENTS

| JP | 58-046637 | 3/1983 |
| JP | 07-297174 | 11/1995 |
| JP | 10-270416 | 10/1998 |
| JP | 11-260777 | 9/1999 |
| JP | 2003-218093 | 7/2003 |

* cited by examiner

*Primary Examiner* — Lan Vinh

(74) *Attorney, Agent, or Firm* — Oblon, Spivak, McClelland, Maier & Neustadt, L.L.P.

(57) ABSTRACT

In a dry etching method, a silicon substrate is mounted on an electrode arranged in a processing chamber; a plasma is generated by discharging an etching gas in the processing chamber; a radio frequency power for attracting ions from the plasma is supplied to the electrode; and the silicon substrate is etched by the plasma. A pressure inside the processing chamber is set as 1 mTorr to 100 mTorr, and the etching is carried out while satisfying the following equation: $yM \geq 2.84 * 10^{-3}x + 0.28$, where yM is a power density of the radio frequency power per unit area of the electrode and x is the pressure inside the processing chamber.

17 Claims, 11 Drawing Sheets

| | GAS & PRESSURE (mTorr) | BIAS RF POWER (watt) | E/R (nm/min) Si | E/R (nm/min) SiN | SELECTIVITY | $V_{dc}$ (volt) | TAPER ANGLE (deg.) | MICRO TRENCH DEPTH (nm) |
|---|---|---|---|---|---|---|---|---|
| COMPARATIVE EXAMPLE 1 | $Cl_2$ (1) | 100 | 72 | 20 | 3.5 | −190 | 84.4 | 22 |
| COMPARATIVE EXAMPLE 2 | $Cl_2$ (20) | 200 | 300 | 20 | 4.5 | −240 | 85.7 | 28 |
| COMPARATIVE EXAMPLE 3 | $Cl_2$ (3) | 100 | 167 | 20 | 4.3 | −170 | 85.3 | 34 |
| COMPARATIVE EXAMPLE 4 | $Cl_2$ (20) | 100 | 282 | 20 | 6.6 | −110 | 84.6 | 48 |

FIG. 4

| | GAS & PRESSURE (mTorr) | BIAS RF POWER (watt) | E/R (nm/min) | | SELECTIVITY | $V_{dc}$ (volt) | TAPER ANGLE (deg.) | MICRO TRENCH DEPTH (nm) |
|---|---|---|---|---|---|---|---|---|
| | | | Si | SiN | | | | |
| TEST EXAMPLE 1 | $Cl_2$ (3) | 400 | 286 | 114 | 2.5 | -450 | 88.7 | 0 |
| TEST EXAMPLE 2 | $Cl_2$ (20) | 600 | 370 | 132 | 2.8 | -480 | 89.0 | 0 |
| TEST EXAMPLE 3 | $Cl_2$ (50) | 800 | 480 | 133 | 3.6 | -430 | 89.8 | 0 |
| TEST EXAMPLE 4 | $Cl_2$ (100) | 800 | 488 | 96 | 5.1 | -250 | 88.2 | 0 |
| TEST EXAMPLE 5 | $Cl_2$ (3) | 300 | 260 | 90 | 2.9 | -370 | 87.0 | 8 |
| TEST EXAMPLE 6 | $Cl_2$ (20) | 370 | 370 | 103 | 3.6 | -350 | 88.2 | 8 |

FIG.5

| | GAS & PRESSURE (mTorr) | BIAS RF POWER (watt) | E/R (nm/min) | | SELECTIVITY | Vdc (volt) | TAPER ANGLE (deg.) | MICRO TRENCH DEPTH (nm) |
|---|---|---|---|---|---|---|---|---|
| | | | Si | SiN | | | | |
| TEST EXAMPLE 7 | Cl₂ (2) | 200 | 186 | 64 | 2.9 | -310 | 86.9 | 14 |
| TEST EXAMPLE 8 | Cl₂ (50) | 400 | 432 | 92 | 4.7 | -220 | 86.4 | 14 |
| TEST EXAMPLE 9 | Cl₂ (5) | 200 | 248 | 75 | 3.3 | -290 | 87.1 | 16 |
| TEST EXAMPLE 10 | Cl₂ (100) | 400 | 440 | 72 | 6.1 | -130 | 83.4 | 16 |
| TEST EXAMPLE 11 | Cl₂ (3) | 200 | 226 | 71 | 3.2 | -300 | 86.8 | 18 |
| TEST EXAMPLE 12 | Cl₂ (20) | 300 | 334 | 86 | 3.9 | -290 | 87.2 | 18 |

FIG.6

| | GAS & PRESSURE (mTorr) | BIAS RF POWER (watt) | E/R (nm/min) | | SELECTIVITY | $V_{dc}$ (volt) | TAPER ANGLE (deg.) | MICRO TRENCH DEPTH (nm) |
|---|---|---|---|---|---|---|---|---|
| | | | Si | SiN | | | | |
| COMPARATIVE EXAMPLE 1 | $Cl_2$ (1) | 100 | 72 | 20 | 3.5 | −190 | 84.4 | 22 |
| COMPARATIVE EXAMPLE 2 | $Cl_2$ (20) | 200 | 300 | 20 | 4.5 | −240 | 85.7 | 28 |
| COMPARATIVE EXAMPLE 3 | $Cl_2$ (3) | 100 | 167 | 20 | 4.3 | −170 | 85.3 | 34 |
| COMPARATIVE EXAMPLE 4 | $Cl_2$ (20) | 100 | 282 | 20 | 6.6 | −110 | 84.6 | 48 | in the next-next generation products, a metal insulator semiconduc-
DRY ETCHING METHOD

CROSS-REFERENCE TO RELATED APPLICATIONS

This application claims priority to Japanese Patent Application No. 2008-233888, filed on Sep. 11, 2008, the entire contents of which are hereby incorporated by reference.

FIELD OF THE INVENTION

The present invention relates to a dry etching method of etching a silicon substrate by using a plasma.

BACKGROUND OF THE INVENTION

When manufacturing semiconductor devices, the processes of forming a thin film on a silicon substrate and lithographing and patterning the thin film by dry etching are repeatedly carried out, and the silicon substrate itself is often dry-etched at the initial stage of the manufacturing processes.

Dry etching of the silicon substrate is mainly carried out for trench formation in silicon, e.g., groove-shaped trenches for device isolation and hole-shaped trenches for capacitor formation. In etching silicon trenches, it is important to control the depth to width ratio (i.e. aspect ratio) and a vertical cross sectional shape of the trench; and especially it is an important issue to prevent bowing, which is a barrel-shaped hollow portion of an inner wall of the trench, and undercut etching below a mask (i.e. side etching) and the like. To solve such technical issue, the etching gas employs a halogen compound gas including hydrogen, such as hydrogen bromide (HBr), or a gaseous mixture in which $CHF_3$ or the like is added to a halogen gas such as $Cl_2$. As for an etching apparatus, a reactive ion etching (RIE) apparatus is employed, which gives the directivity to ions in the plasma and allows the ions to react with a target object (silicon substrate) (see, e.g., the Japanese Patent Laid-open Application No. 2003-218093).

With ever-increasing demands for high-integration and high-performance of the semiconductor devices manufactured on the silicon substrate, semiconductor elements constituting the devices are made smaller by a scaling rule of about 0.7-times. Therefore, 65 nm and 45 nm design rule (i.e. design standard), which are currently applied to the state-of-the-art semiconductor products, are expected to become about 32 nm in the next-generation products and about 22 nm in the next-next generation products.

If the device design standard approaches to 22 nm in the next-next generation products, a metal insulator semiconductor field effect transistor (MISFET), which is a basic semiconductor device for the large scale integration (LSI) circuits, is highly likely to be changed from a two-dimensional structure (planar structure), in which its channel, source and drain regions are two-dimensionally formed on a main surface of a silicon substrate, to a three-dimensional structure (stereoscopic structure), in which such regions are three-dimensionally formed on the main surface of the silicon substrate.

In the three-dimensional structure, the channel region is formed on a sidewall of a fin or a pillar, which may protrude and extend above the main surface of the silicon substrate, and the source and drain regions are formed at opposite sides of the channel region in the channel length direction. Here, a three-dimensional element body such as the fin or the pillar may be obtained by etching the main surface of the silicon substrate down to a depth of 100 nm or more.

In the etching process of such a three-dimensional element, it is an important issue to minimize the damage to an etched sidewall of a target object and prevent an undesirable groove (a microtrench) from being formed in a lower end portion of the etched sidewall (a lower portion of the main body). In other words, the etched sidewall in this process is employed as the channel region of the MISFET, unlike in the case of a conventional trench etching. Accordingly, if ions are incident on the sidewall, and thus the crystal lattice at the surface region thereof is damaged, the mobility of electrons or holes (charge carriers) is decreased and the performance of the MISFET is significantly deteriorated. Further, if the microtrench is formed at a lower portion of the pillar, such microtrench tends to hinder the formation of an impurity region (the source or the drain region). The accuracy in a vertical shape of the sidewall of the target object is also required for the stability and the reproducibility of the performance of the MISFET.

SUMMARY OF THE INVENTION

In view of the above, the present invention provides a dry etching method that can prevent damage of a sidewall and microtrench formation while preserving vertical trench formation in an etching process of a silicon substrate, especially in an etching process for forming a three-dimensional structure.

In accordance with a first aspect of the present invention, there is provided a dry etching method including: mounting a silicon substrate on an electrode arranged in a processing chamber; generating a plasma by discharging an etching gas in the processing chamber; supplying to the electrode a radio frequency power for attracting ions from the plasma; and etching the silicon substrate by the plasma.

A pressure inside the processing chamber is set as about 1 mTorr to 100 mTorr, and the etching is carried out while satisfying the following equation: $yS \geq -1.7x+295$, where $yS$ is the absolute value of a self-bias voltage generated in the electrode and $x$ is the pressure inside the processing chamber.

In accordance with a first aspect of the present invention, there is provided a dry etching method including: mounting a silicon substrate on an electrode arranged in a processing chamber; generating a plasma by discharging an etching gas in the processing chamber; supplying to the electrode a radio frequency power for attracting ions from the plasma; and etching the silicon substrate by the plasma. A pressure inside the processing chamber is set as about 1 mTorr to 100 mTorr, and wherein the etching is carried out while satisfying the following equation: $yM \geq 2.84 *10^{-3}x+0.28$, where $yM$ is the power density of the radio frequency power per unit area of the electrode and $x$ is the pressure inside the processing chamber.

BRIEF DESCRIPTION OF THE DRAWINGS

The objects and features of the present invention will become apparent from the following description of embodiments, given in conjunction with the accompanying drawings, in which:

FIG. 4 is a table where parameters used in first to sixth test examples, respectively, and obtained etching characteristics are listed for a dry etching in accordance with the embodiment of the present invention;

FIG. 5 is a table where parameters used in seventh to twelfth test examples, respectively, and obtained etching characteristics are listed for the dry etching in accordance with the embodiment of the present invention;

FIG. 6 is a table where parameters used in first to fourth comparative examples, respectively, and obtained etching characteristics are listed for the dry etching in accordance with the embodiment of the present invention;

DETAILED DESCRIPTION OF THE EMBODIMENTS

An embodiment of the present invention will now be described with reference to the accompanying drawings, which form a part hereof.

Figure 1:
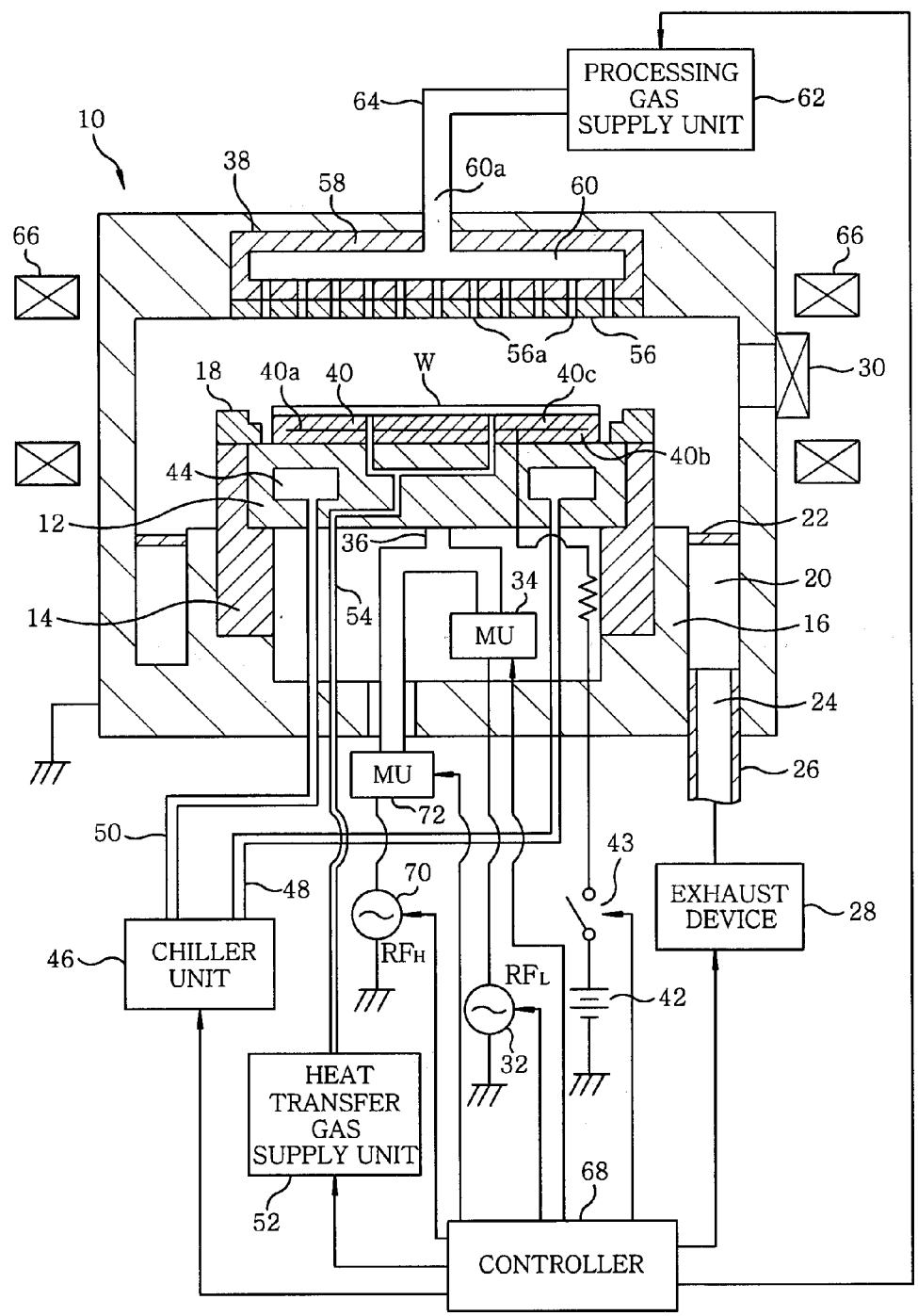
FIG. 1 is a vertical cross sectional view showing the structure of a plasma etching apparatus for executing a dry etching method in accordance with an embodiment of the present invention.

FIG. 1 shows the structure of a plasma etching apparatus for executing a dry etching method in accordance with the present invention. The plasma etching apparatus is of a capacitively coupled parallel plate type where dual RF frequencies are applied to a lower electrode, and includes a cylindrical chamber (processing chamber) 10 made of a metal, e.g., aluminum, stainless steel or the like. The chamber 10 is frame-grounded.

In the chamber 10, a cylindrical susceptor 12 serving as a lower electrode is placed to mount a target object (i.e. a target substrate) thereon. The susceptor 12, which is made of, e.g., aluminum, is supported by an insulating tubular support 14, which is in turn supported by a cylindrical support 16 vertically extending from a bottom portion of the chamber 10 upwardly. A focus ring 18 made of, e.g., quartz or silicon is arranged on an upper surface of the tubular support 14 to annularly surround a peripheral part of a top surface of the susceptor 12.

An exhaust path 20 is formed between a sidewall of the chamber 10 and the cylindrical support 16. An annular baffle plate 22 is attached to the entrance or the inside of the exhaust path 20, and an exhaust port 24 is disposed at a bottom portion of the chamber 10. An exhaust device 28 is connected to the exhaust port 24 via an exhaust pipe 26. The exhaust device 28 includes a vacuum pump to evacuate an inner space of the chamber 10 to a predetermined vacuum level. Attached to the sidewall of the chamber 10 is a gate valve 30 for opening and closing a gateway through which a silicon wafer W is loaded or unloaded.

A first high frequency power supply 32 for attracting ions is electrically connected to the susceptor 12 via a first matching unit (MU) 34 and a power feed rod 36. The first high frequency power supply 32 supplies a first radio frequency power $RF_L$ to the susceptor 12. The first radio frequency power $RF_L$ has a frequency that is equal to or smaller than about 13.56 MHz, adequate to attract ions in the plasma to the silicon wafer W.

A second high frequency power supply 70 for generating a plasma is also electrically connected to the susceptor 12 via a second matching unit (MU) 72 and the power feed rod 36. The second high-frequency power supply 70 supplies a second radio frequency power $RF_H$ to the susceptor 12. The second radio frequency power $RF_H$ has a frequency that is equal to or greater than about 40 MHz, adequate to discharge an etching gas by the radio frequency power.

At a ceiling portion of the chamber 10, a shower head 38 is placed as an upper electrode of ground potential. The first and the second radio frequency power $RF_L$ and $RF_H$ respectively supplied from the first and second high frequency power supply 32 and 70 are capacitively applied between the susceptor 12 and the shower head 38.

An electrostatic chuck 40 is placed on the top surface of the susceptor 12 to hold the silicon wafer W by an electrostatic force. The electrostatic chuck 40 includes an electrode 40a made of a conductive film and a pair of insulation films 40b and 40c. The electrode 40a is interposed between the insulation films 40b and 40c. A DC power supply 42 is electrically connected to the electrode 40a via a switch 43. By a DC voltage supplied from the DC power supply 42, the silicon wafer W can be attracted to and held by the electrostatic chuck 40 by the Coulomb force.

A coolant chamber 44, which extends in, e.g., a circumferential direction, is installed inside the susceptor 12. A coolant, e.g., a cooling water, of a predetermined temperature is circularly supplied from a chiller unit 46 to the coolant chamber 44 via pipelines 48 and 50. It is possible to control a process temperature of the silicon wafer W held on the electrostatic chuck 40 by adjusting the temperature of the coolant. Moreover, a heat transfer gas, e.g., He gas, is supplied from a heat transfer gas supply unit 52 to a space between a top surface of the electrostatic chuck 40 and a bottom surface of the silicon wafer W through a gas supply line 54.

The shower head 38 placed at the ceiling portion of the chamber 10 includes a lower electrode plate 56 having a plurality of gas injection holes 56a and an electrode support 58 that detachably supports the electrode plate 56. A buffer chamber 60 is provided inside the electrode support 58. A processing gas supply unit 62 is connected to a gas inlet opening 60a of the buffer chamber 60 via a gas supply line 64.

Provided along a circumference of the chamber 10 is a magnet unit 66 extending annularly or concentrically around the chamber 10. In the chamber 10, a high density plasma is generated near the surface of the susceptor 12 by the collective action of an RF electric field, which is produced between the shower head 38 and the susceptor 12 by the second radio frequency power $RF_H$, and a magnetic field generated by the magnet unit 66. In this present embodiment, even though a plasma generation space inside the chamber 10, especially the plasma generation space between the shower head 38 and the susceptor 12 has a low pressure of about 1 mTorr (about 0.133 Pa), it is possible to obtain a high density plasma having electron density of about $1 \times 10^{10}/cm^3$ or more in order to execute the dry etching method of the present invention.

A controller 68 controls operations of various parts of the plasma etching apparatus, e.g., the exhaust device 28, the first high frequency power supply 32, the first matching unit 34, the switch 43, the chiller unit 46, the heat transfer gas supply unit 52, the processing gas supply unit 62, the second high frequency power supply 70, the second matching unit 72, and the like. The controller 68 is connected to a host computer (not shown) and the like.

In the plasma etching apparatus, the gate valve 30 is opened first, and a target object, i.e., the silicon wafer W, is loaded in the chamber 10 and mounted on the electrostatic chuck 40 to perform the dry etching. Then, the etching gas is supplied from the processing gas supply unit 62 to the chamber 10 at a predetermined flow rate and flow rate ratio, and the pressure inside the chamber 10 is adjusted by the exhaust device 28 at a preset level. Moreover, the first radio frequency power $RF_L$ having a preset level is supplied from the first high frequency power supply 32 to the susceptor 12 and the second radio frequency power $RF_H$ having a preset level is supplied by the second radio frequency power supply 70 to the susceptor 12.

A DC voltage is supplied by the DC power supply 42 to the electrode 40a of the electrostatic chuck 40 so that the silicon wafer W is firmly mounted on the electrostatic chuck 40. The etching gas injected from the shower head 38 is glow-discharged between the electrodes 12 and 38 to thereby be converted into a plasma. Radicals or ions generated in the plasma pass through openings in an etching mask on the surface of the silicon wafer W and react with the target object (e.g., the silicon substrate), thereby etching the target object in a desired pattern.

In such a dry etching process, the radio frequency power $RF_H$ having a relatively high frequency (e.g., about 40 MHz or more, and preferably about 80 MHz or more) supplied from the second radio frequency power supply 70 to the susceptor (lower electrode) 12 mainly contributes to the discharge of the etching gas or the generation of the plasma; and the first radio frequency power $RF_L$ having a relatively low frequency (e.g., about 27 MHz or less, or preferably about 13.56 MHz or less) supplied from the first high frequency power supply 32 to the susceptor (lower electrode) 12 mainly contributes to ion attraction from the plasma to the silicon wafer W.

During the dry etching, that is, while the plasma is generated in the processing space, a lower ion sheath is formed between the bulk plasma and the susceptor (lower electrode) 12. As a result, a negative self-bias voltage $V_{dc}$, having the substantially same magnitude as a voltage drop of the lower ion sheath, is produced at the susceptor 12 and the silicon wafer W. An absolute value $|V_{dc}|$ of the self-bias voltage is substantially in proportion to a peak-to-peak value $V_{pp}$ of the voltage of the first radio frequency power $RF_L$ supplied to the susceptor 12. The plasma etching apparatus of the present embodiment (FIG. 1) is configured to obtain the self-bias voltage $V_{dc}$ of at least −600 V to −120 V in order to execute the dry etching method of the present invention.

As an example of the etching process to which the present invention can be adequately applied, a dry etching method for forming a pillar-shaped element body for a vertical transistor on a main surface of the silicon wafer W in according to the embodiment of the present invention will be described below with reference to FIGS. 2A to 12.

Figure 2A:
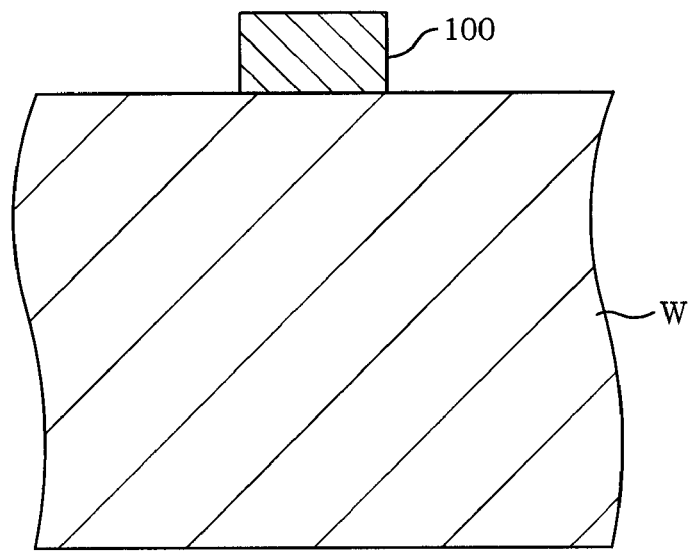
FIG. 2A is a vertical cross sectional view showing one step of an etching process of forming a cylindrical pillar-shaped element body by using a dry etching method in accordance with the embodiment of the present invention.
Figure 2B:
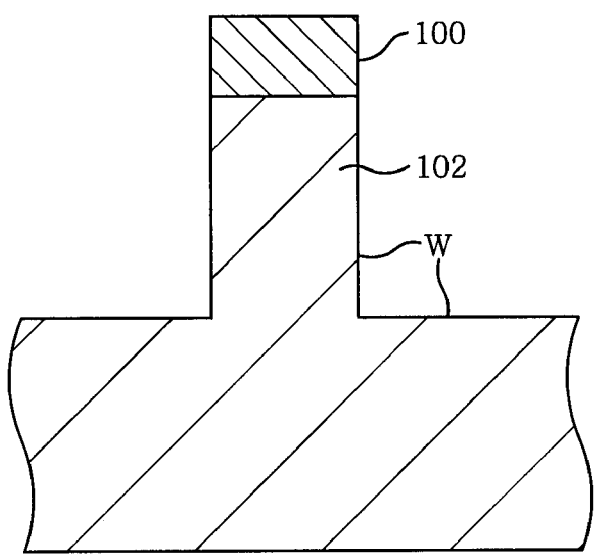
FIG. 2B is a vertical cross sectional view showing another step of an etching process of forming a cylindrical pillar-shaped element body by using a dry etching method in accordance with the embodiment of the present invention.
Figure 3A:
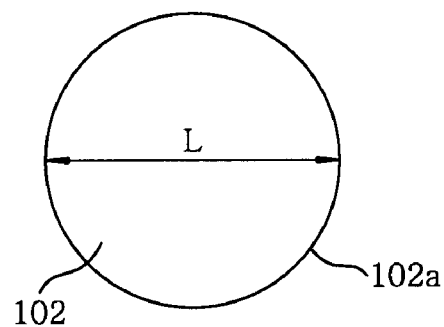
FIG. 3A is a front view showing a cylindrical pillar-shaped element body which is formed by using a dry etching method in accordance with the embodiment of the present invention.
Figure 3B:
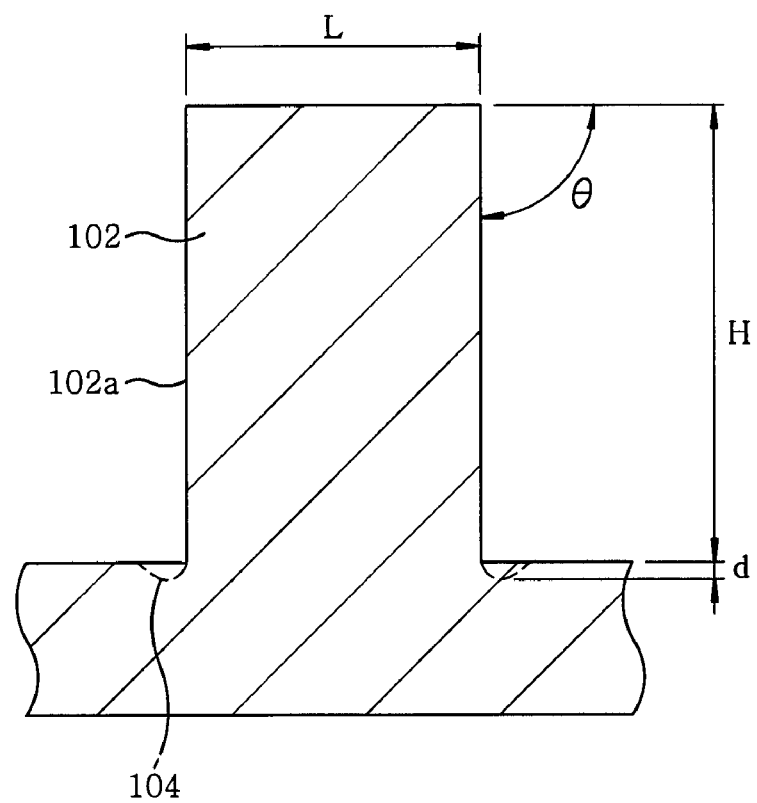
FIG. 3B is a vertical cross sectional view showing a cylindrical pillar-shaped element body which is formed by using a dry etching method in accordance with the embodiment of the present invention.

In order to form such kind of pillar-shaped element body, a mask material (preferably an inorganic layer) is applied on the silicon wafer W and then is patterned into a circular plate 100 having a predetermined diameter as shown in FIG. 2A. Therefore, the silicon wafer W is etched down to a desired depth by using the circular plate 100 as an etching mask as shown in FIG. 2B. Then, as shown in FIGS. 3A and 3B, a cylindrical pillar-shaped element body 102 having desirable dimensions, e.g., the diameter L of about 20 nm and the depth H of about 200 nm, is formed on the main surface of the silicon wafer W. FIGS. 3A and 3B are a plan view and a vertical cross sectional view of the pillar-shaped element body 102, often removing the etching mask 100 (FIGS. 2A and 2B).

Below are the important requirements for the silicon dry etching to form the pillar-shaped element body 102. First, damage to a pillar sidewall 102a by ion impact or ion incidence thereon needs to be minimized or completely avoided. Second, the pillar sidewall 102a needs to be etched to be as vertical as possible. (ideally, a taper angle θ is about 90°). Finally, the depth of a microtrench 104 which may be formed in a groove or a dent shape near the bottom edge of the pillar-shaped element body 102 needs to be minimized (ideally, the depth d is 0).

In the present embodiment, an etching experiment of forming the pillar-shaped element body 102 was performed by executing the dry etching of the silicon wafer W under various conditions by using the plasma etching apparatus shown in FIG. 1. Main conditions are as follows. The experiment was carried out by changing three parameters, i.e., the pressure of the chamber 10, the power (bias RF power) of the first radio frequency power $RF_L$ for ion attraction, and the self-bias voltage $V_{dc}$.

Diameter of silicon wafer: 300 mm

Etching mask: SiN (150 nm) on $SiO_2$

Etching gas: $Cl_2$ gas of 100 sccm

Chamber pressure: 1 mTorr to 100 mTorr

First radio frequency power: about 13 MHz, and Bias RF power: 100 W to 800 W

Second radio frequency power: 100 MHz, and RF power 500 W

Self-bias voltage $V_{dc}$: −480 V to −130 V

Distance between upper and lower electrodes: 30 mm

Area of 1 lower electrode: about 703.1 $cm^2$ (Diameter: 300 mm)

Temperature: upper electrode/sidewall of chamber/lower electrode=80/70/85° C.

Etching time: 30 seconds to 50 seconds

TEST EXAMPLES

FIGS. 4 and 5 are tables where parameters used in first to twelfth test examples, respectively, and obtained etching characteristics are listed.

First Test Example

The gas pressure was 3 mTorr; the bias RF power was 400 W; and the self-bias voltage $V_{dc}$ was −450 V. The etching result of the microtrench depth d of 0 nm and the taper angle θ of 88.7° were obtained.

Second Test Example

The gas pressure was 20 mTorr; the bias RF power was 600 W; and the self-bias voltage $V_{dc}$ was −480 V. The etching result of the microtrench depth d of 0 nm and the taper angle θ of 89.0° were obtained.

Third Test Example

The gas pressure was 50 mTorr; the bias RF power was 800 W; and the self-bias voltage $V_{dc}$ was −430 V. The etching result of the microtrench depth d of 0 nm and the taper angle θ of 89.8° were obtained.

Fourth Test Example

The gas pressure was 100 mTorr; the bias RF power was 800 W; and the self-bias voltage $V_{dc}$ was −250 V. The etching result of the microtrench depth d of 0 nm and the taper angle θ of 88.2° were obtained.

Fifth Test Example

The gas pressure was 3 mTorr; the bias RF power was 300 W; and the self-bias voltage $V_{dc}$ was −370 V. The etching result of the microtrench depth d of 8 nm and the taper angle θ of 87.0° were obtained.

Sixth Test Example

The gas pressure was 20 mTorr; the bias RF power was 400 W; and the self-bias voltage $V_{dc}$ was −350 V. The etching result of the microtrench depth d of 8 nm and the taper angle θ of 88.2° were obtained.

Seventh Test Example

The gas pressure was 2 mTorr; the bias RF power was 200 W; and the self-bias voltage $V_{dc}$ was −310 V. The etching result of the microtrench depth d of 14 nm and the taper angle θ of 88.9° were obtained.

Eighth Test Example

The gas pressure was 50 mTorr; the bias RF power was 400 W; and the self-bias voltage $V_{dc}$ was −220 V. The etching result of the microtrench depth d of 14 nm and the taper angle θ of 86.4° were obtained.

Ninth Test Example

The gas pressure was 5 mTorr; the bias RF power was 200 W; and the self-bias voltage $V_{dc}$ was −290 V. The etching result of the microtrench depth d of 16 nm and the taper angle θ of 87.1° were obtained.

Tenth Test Example

The gas pressure was 100 mTorr; the bias RF power was 400 W; and the self-bias voltage $V_{dc}$ was −130 V. The etching result of the microtrench depth d of 16 nm and the taper angle θ of 83.4° were obtained.

Eleventh Test Example

The gas pressure was 3 mTorr; the bias RF power was 200 W; and the self-bias voltage $V_{dc}$ was −300 V. The etching result of the microtrench depth d of 18 nm and the taper angle θ of 86.8° were obtained.

Twelfth Test Example

The gas pressure was 20 mTorr; the bias RF power was 300 W; and the self-bias voltage $V_{dc}$ was −290 V. The etching result of the microtrench depth d of 18 nm and the taper angle θ of 87.4° were obtained.

COMPARATIVE EXAMPLES

FIG. 6 is a table where parameters used in the first to the fourth comparative examples and obtained etching characteristics are listed.

First Comparative Example

The gas pressure was 1 mTorr; the bias RF power was 100 W; and the self-bias voltage $V_{dc}$ was −190 V. The etching result of the microtrench depth d of 22 nm and the taper angle θ of 84.4° were obtained.

Second Comparative Example

The gas pressure was 20 mTorr; the bias RF power was 200 W; and the self-bias voltage $V_{dc}$ was −240 V. The etching result of the microtrench depth d of 28 nm and the taper angle θ of 85.7° were obtained.

Third Comparative Example

The gas pressure was 3 mTorr; the bias RF power was 100 W; and the self-bias voltage $V_{dc}$ was −170 V. The etching result of the microtrench depth d of 34 nm and the taper angle θ of 85.3° were obtained.

Fourth Comparative Example

The gas pressure was 20 mTorr; the bias RF power was 100 W; and the self-bias voltage $V_{dc}$ was −110 V. The etching result of the microtrench depth d of 48 nm and the taper angle θ of 84.6° were obtained.

As described above, the microtrench depths d of the first to the twelfth test examples were equal to or smaller than 20 nm which is practically acceptable. In contrast, the microtrench depths d had unacceptably large values of greater than 20 nm of the first to the fourth comparative examples.

Since, in the etching processes of the above experiment, the single gas $Cl_2$ was used as the etching gas, and an inorganic multi-layer (SiN layer on $SiO_2$ layer) not containing hydrogen and carbon was used as the etching mask 100, a polymer film or the like is unlikely to be deposited on a sidewall of the pillar. As a result, the so-called sidewall protection effect is expected to be insignificant. Accordingly, as the taper angle θ of the sidewall is made closer to 90°, the sidewall becomes less subject to ion impact or ion incidence thereto. In the first to the twelfth test examples, the taper angle θ was a practically acceptable level of 86°. In contrast, in the first to the fourth comparative examples, the taper angle θ was smaller than 86°, which is practically acceptable. The $SiO_2$ layer in a lower portion of the etching mask 100 serves to alleviate the stress on the SiN layer.

Figure 7:
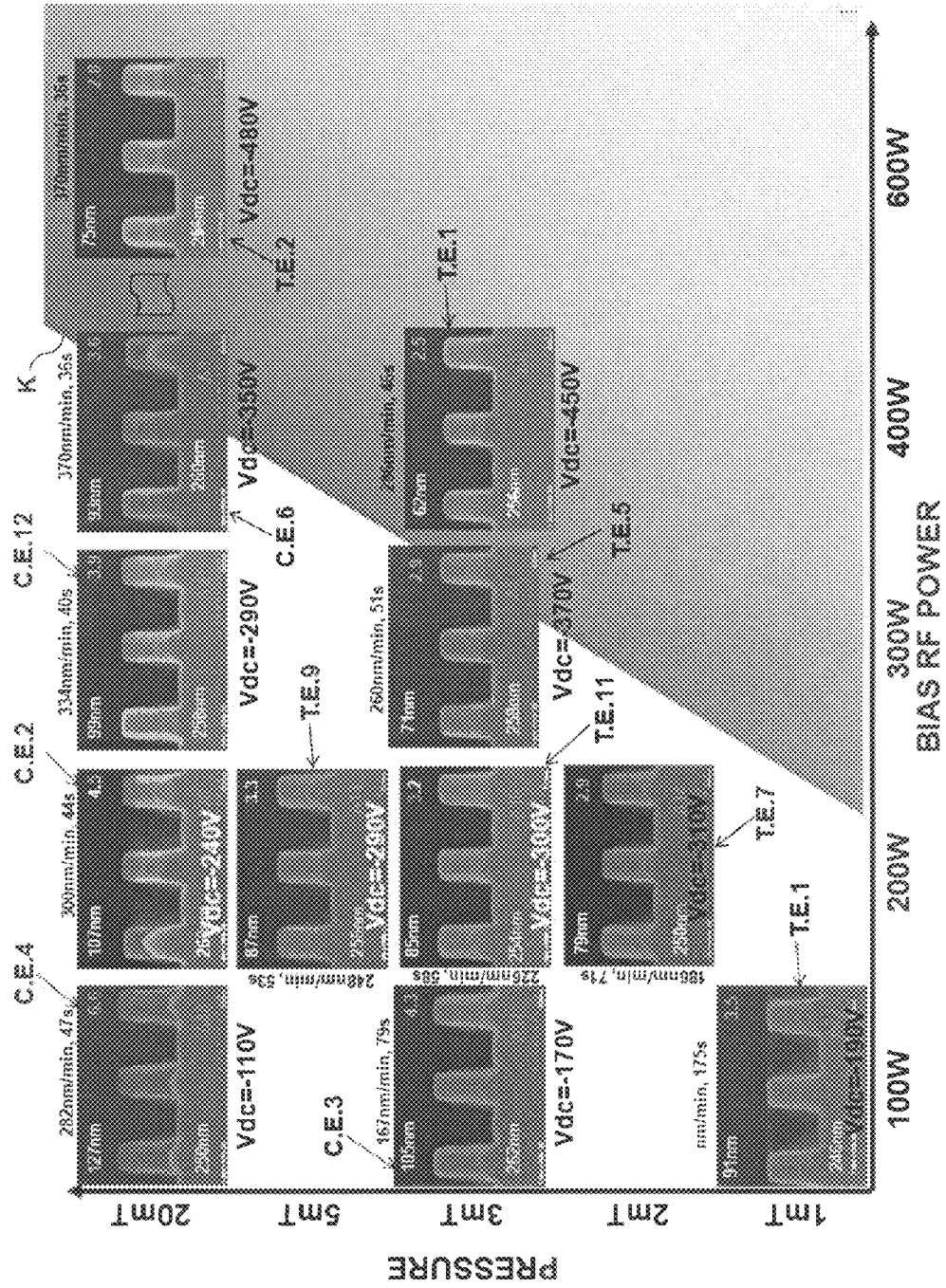
FIG. 7 is a view in which SEM pictures are mapped according to pressure and bias RF power to show a cross section of each of the etched pillars obtained from the test examples and the comparative examples.
Figure 8:
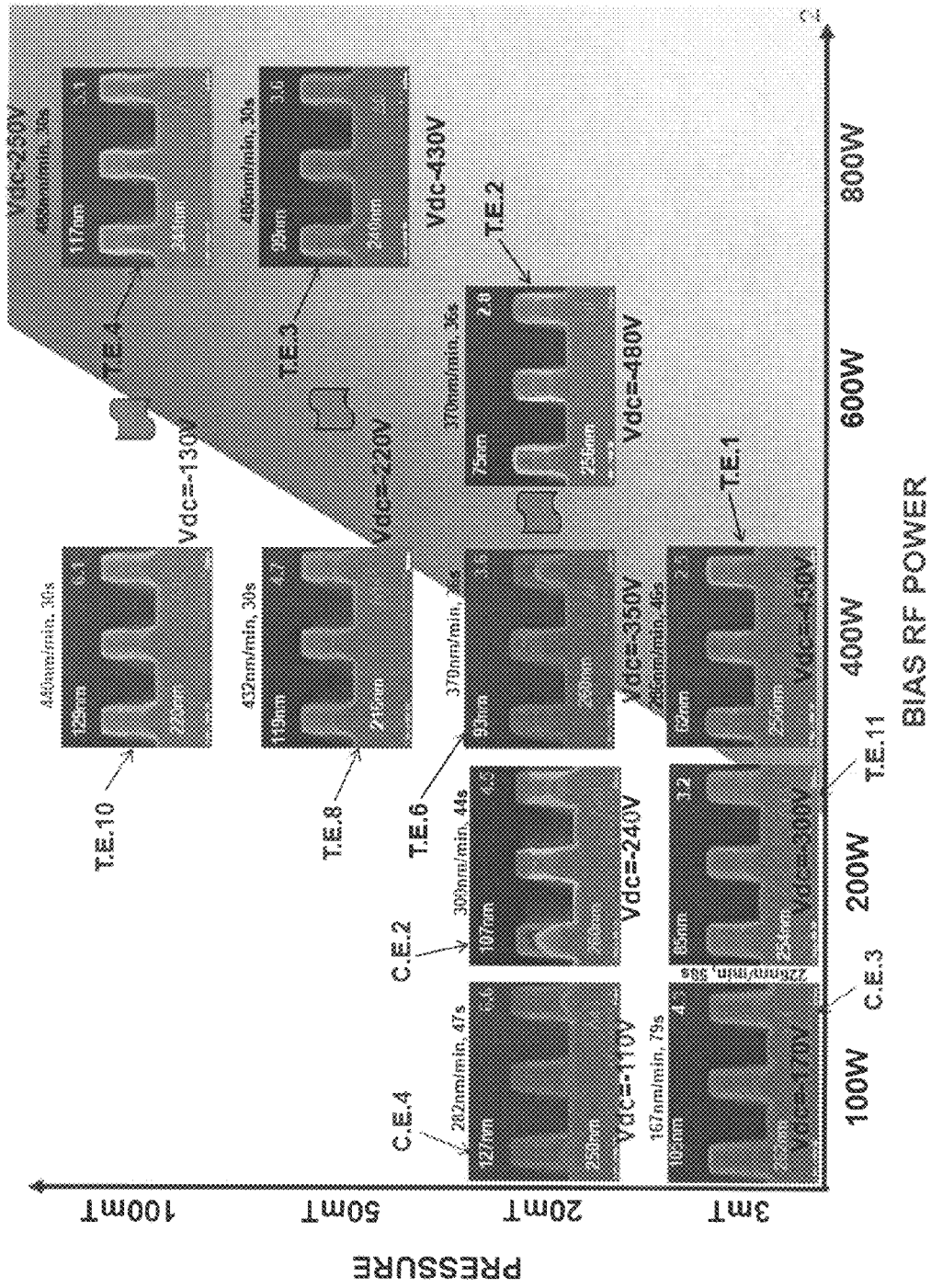
FIG. 8 is a view in which SEM pictures are mapped according to pressure and bias RF power to show a cross section of each of the etched pillars obtained from the test examples and the comparative examples.

FIGS. 7 and 8 are views in which SEM pictures are mapped according to pressure and bias RF power to show a cross section of each of the etched pillars obtained from the test examples and the comparative examples, where the horizontal axis is the bias RF power and the vertical axis is the pressure.

Figure 9:
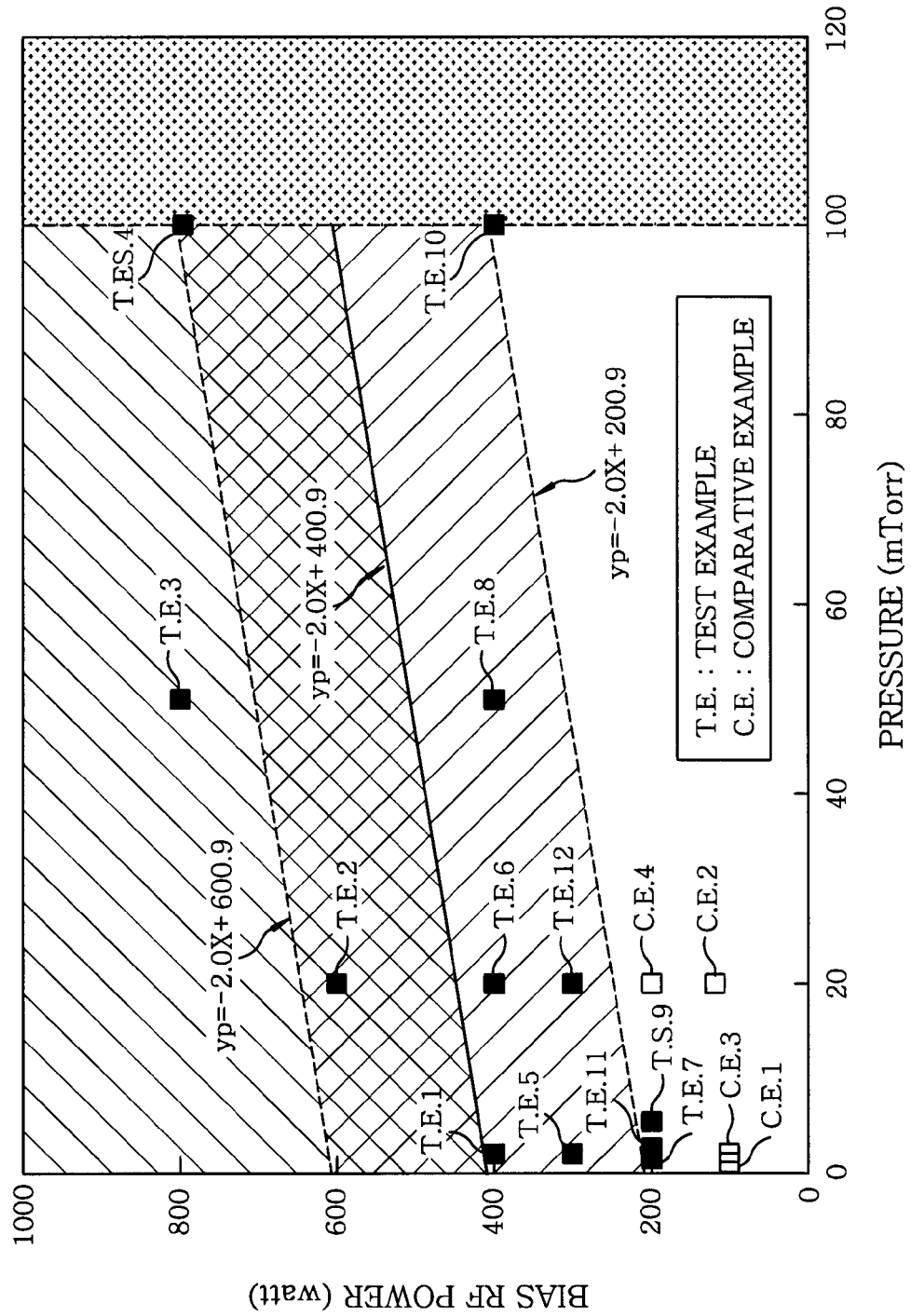
FIG. 9 shows distribution of the test example and the comparative example mapped according to two parameter values (pressure and bias RF power) employed therein.

FIG. 9 shows distribution of the test example and the comparative example mapped according to two parameter values (pressure and bias RF power) employed therein. As shown in FIG. 9, when the pressure (mTorr) is represented as x and the bias RF power (watt) is represented as yP, the first to the twelfth test example are distributed near a straight line of yP=2.0x+400.9, but the first to the fourth comparative examples are distributed distant from that line.

Specifically, the first to the fourth test examples having the microtrench depth d of 0 nm are distributed substantially on or above the straight line of yP=2.0x+400.9 and in a region thereabove and the fifth to the twelfth test examples having the microtrench depth d of 8 to 18 nm are distributed substantially on a straight line of yP=2.0x+400.9 and a region between the straight line of yP=2.0x+200.9 and the straight line of yP=2.0x+400.9. In contrast, all the comparative examples exist in a region below the straight line of yP=2.0x+200.9. The straight line of yP=2.0x+400.9 shown in FIG. 9 approximately coincides with a straight line K shown in FIG. 7 and FIG. 8.

Accordingly, it can be seen from the present embodiment that satisfactory results can be obtained if the relationship between the pressure x and the bias RF power yP satisfies the following Eq. 1 and, preferably, Eq. 2:

$$yP \geq 2.0x+200.9 \qquad \text{Eq. 1, and}$$

$$yP \geq 2.0x+400.9 \qquad \text{Eq. 2.}$$

In a region on or above a straight line of yP=2.0x+600.9, however, the vertical pattern processability is lowered a little like as in the third and the fourth test examples. Accordingly, in the present embodiment, the more preferable relationship between the pressure x and the bias RF power yP satisfies the following Eq. 3:

$$2.0x+400.9 \leq yP < 2.0x+600.9 \qquad \text{Eq. 3.}$$

The bias RF power yP can be converted to the power per unit area of the susceptor (i.e., lower electrode) 12, i.e., bias RF power density yM (watt/cm$^2$).

In the present embodiment, if it is assumed that the diameter of the susceptor 12 is approximately identical to that of the wafer (i.e., 300 mm), the lower electrode area is 703.1 cm$^2$, which yields the relationship between the bias RF power yP and the bias RF power density yM as follows:

$$yP=703.1*yM \qquad \text{Eq. 4}$$

By using Eq. 4, the above Eqs. 1, 2, and 3 can be converted to the following Eqs. 1', 2', and 3':

$$yM \geq 2.84*10^{-3}x+0.28 \qquad \text{Eq. 1'}$$

$$yM \geq 2.84*10^{-3}x+0.57 \qquad \text{Eq. 2', and}$$

$$2.84\times10^{-3}x+0.57 \leq yM \leq 2.84*10^{-3}x+0.85 \qquad \text{Eq. 3'.}$$

Figure 10:
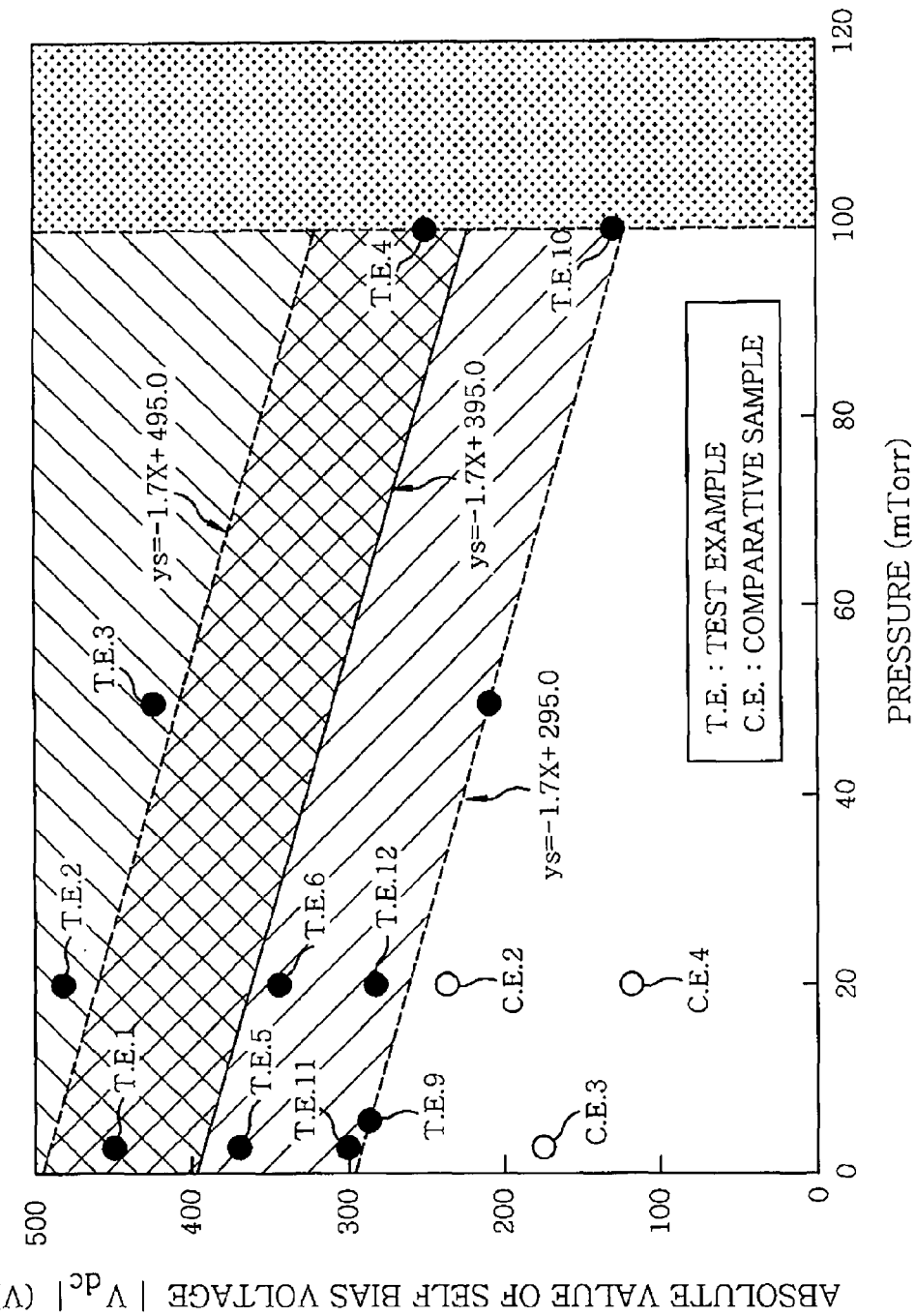
FIG. 10 shows distribution of the test example and the comparative example mapped according to two parameter values (pressure and self-bias voltage) employed therein.

FIG. 10 shows distribution of the test example and the comparative example mapped according to two parameter values (pressure and self-bias voltage $V_{dc}$) employed therein. As shown in FIG. 10, when the pressure (mTorr) is represented as x and an absolute value $|V_{dc}|$ (V) of the self-bias voltage is represented as yS, the first to the twelfth test examples are distributed near a straight line of yS=−1.7x+395.0, but the first to the fourth comparative examples are distributed distant from that line.

Specifically, the first to the fourth test examples having the microtrench depth d of 0 nm are distributed or above the straight line of yS=−1.7x+395.0, and the fifth to the twelfth test examples having the microtrench depth d of 8 to 18 nm are distributed substantially on a straight line of yS=−1.7x+295.0 and a region between the straight line of yS=−1.7x+295.0 and the straight line of yS=−1.7x+395.0. All the comparative examples exist in a region below the straight line of yS=−1.7x+295.0.

Accordingly, it can be seen from the present embodiment that satisfactory results can be obtained if the relationship between the pressure x and the absolute value of the self-bias voltage yS satisfies the following Eq. 5 and, preferably, the Eq. 6:

$$yS \geq -1.7x+295.0 \qquad \text{Eq. 5, and}$$

$$yS \geq -1.7x+395.0 \qquad \text{Eq. 6.}$$

In a region above a straight line of yS=−1.7x+495.0, however, the vertical pattern processability is lowered a little like as in the third and the fourth test examples. Accordingly, in the present embodiment, the more preferable relationship between the pressure x and the bias RF power yP satisfies the following Eq. 7:

$$-1.7x+395.0 \leq yS \leq -1.7x+495.0 \qquad \text{Eq. 7.}$$

Moreover, it is possible to obtain more preferable etching characteristics when any one of Eqs. 1', 2', and 3' and any one of Eqs. 5, 6, and 7 are simultaneously satisfied. Especially, it is possible to obtain most preferable etching characteristics when Eqs. 3' and 7 are simultaneously satisfied.

As will be described later, the simulation proves that if the pressure inside the chamber 10 is greater than 100 mTorr, the ion incident angle distribution significantly becomes widened, and thus the bowing is easy to occur. Accordingly, in the dry etching method in accordance with the embodiment of the present invention, it is preferable that the pressure ranges from 1 mTorr to 100 mTorr.

Generally, in the dry etching, the incident angle (i.e., the angle between an incident path of an ion and the normal line) of the ion that travels from plasma to the target object is dependent on ion temperature $T_i$, electron temperature $T_e$, self-bias voltage $V_{dc}$, electron density $N_e$, and pressure P. Specifically, the ion incident angle becomes closer to zero as the ion temperature $T_i$ becomes lower, the absolute value of the self-bias voltage $V_{dc}$ becomes greater (i.e., acceleration of ion attraction becomes greater), the pressure P becomes lower (i.e., ion mean free path becomes greater), and the electron density $N_e$ becomes higher (i.e., ion sheath becomes thinner).

Figure 11:
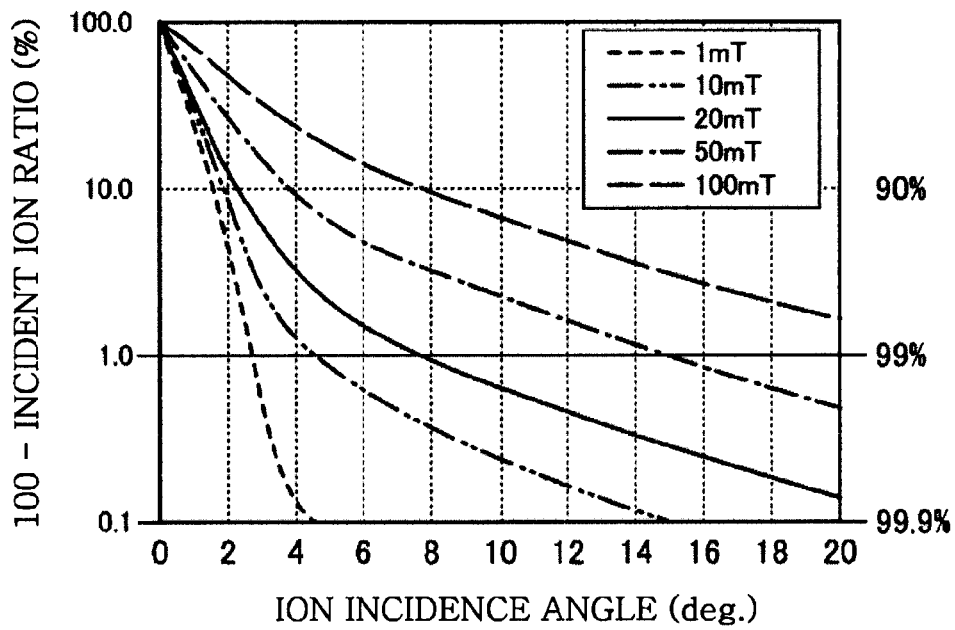
FIG. 11 shows a normalized ion incident angle distribution characteristic obtained when the pressure P was changed as a parameter in the reference condition.

Simulation was carried out to obtain normalized ion incident angle distribution characteristics by using the reference conditions that the pressure P=10 mTorr, the electron density $N_e$=1×10$^{10}$/cm$^3$, the electron temperature $T_e$=1.3 eV, the ion temperature $T_i$=0.1 eV, the self-bias voltage $V_{dc}$=−100 V and the peak-to-peak value $V_{pp}$=500 V, are determined as reference conditions. FIG. 11 shows a normalized ion incident angle distribution characteristic obtained when the pressure P was changed as a parameter in the reference condition and FIG. 12 shows a normalized ion incident angle distribution characteristic obtained when the self-bias voltage $V_{dc}$ was changed as a parameter in the reference condition.

As shown in FIG. 11, as the pressure P becomes smaller, the ion incident angles are distributed to be smaller. For example, 99% of the ions incident on the target object are distributed within the incident angle of 15°, 8°, 4.6°, and 2.8° at the pressure P of 50 mTorr, 20 mTorr, 10 mTorr, and 1 mTorr, respectively. However, at the pressure P of 100 mTorr, the 99% of ions are much more widely distributed beyond the incident angle of 20°. In another point of view, greater than 90% of ions are distributed within the incident angle of 4° at the pressures P of 1 to 50 mTorr, while only 80% of ions are distributed within the incident angle of 4° at the pressure of 100 mTorr.

Accordingly, in the present embodiment, the maximum of the usable pressure is 100 mTorr. If the pressure P is greater than 100 mTorr, the ion incident angle distribution is too wide. As a result, the unpreferable bowing pattern is easy to occur.

Figure 12:
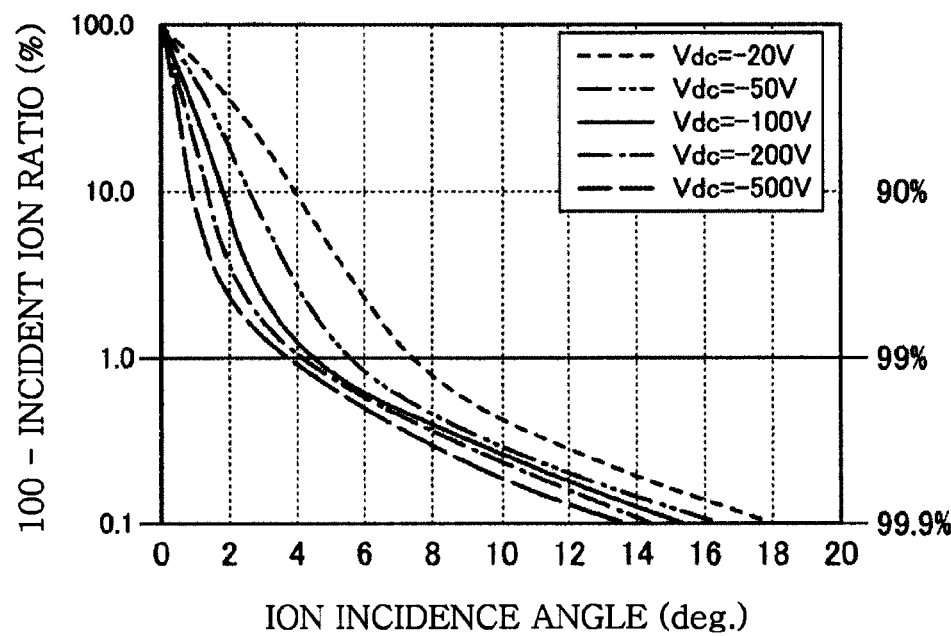
FIG. 12 shows a normalized ion incident angle distribution characteristic obtained when the self-bias voltage was changed as a parameter in the reference condition.

As shown in FIG. 12, as the absolute value $|V_{dc}|$ of the self-bias voltage becomes greater, the ion incident angles are distributed to be smaller. However, the pressure P is not significantly changed, and 90% of ions are distributed within the incident angle of 4° even in the case of −20 V. However, in the present invention, the pressure is limited to 100 mTorr or less. Accordingly, the absolute value $|V_{dc}|$ of the self-bias voltage is limited to 125 V or more.

The electron density $N_e$ is required to be preferably higher to distribute the ion incident angles to be smaller. In the present invention, the electron density $N_e$ is equal to or greater than $1\times10^{10}$/cm$^3$ preferably.

In the present embodiment, the temperature of the susceptor (lower substrate) 12 is set as 85° C., which is higher than the normal susceptor temperature. This makes it difficult for reaction products to be deposited and further improves the vertical pattern processability and the effect of preventing formation of microtrenchs. In the embodiment of the present invention, the temperature of the susceptor 12 is set preferably as 40° C. or more, more preferably, as 60° C. or more, and most preferably as 80° C. or more.

In accordance with the dry etching method of the embodiment of the present invention, it is possible to prevent damage of a sidewall and microtrench formation while preserving vertical trench formation in an etching process of a silicon substrate, especially in an etching process for forming a three-dimensional structure.

While the invention has been shown and described with respect to the embodiments, it will be understood by those skilled in the art that various changes and modification may be made without departing from the scope of the invention as defined in the following claims.

For example, though it is most preferable to employ Cl$_2$ gas as the etching gas of the present embodiment, it is possible to use other halogen gas such as fluorine (F$_2$) gas, bromine (Br$_2$) gas, and iodine (I$_2$) gas. Alternatively, the etching gas can be a gases mixture in which halogen gas and inactive gas or noble gas such as helium, argon, or the like are mixed.

The plasma etching apparatus usable for the dry etching method of the present invention is not limited to the aforementioned embodiment, but various modifications are possible. For example, it is possible to use an upper-and-lower plate dual frequency application type plasma etching apparatus, which a high frequency power for plasma generation is applied to an upper electrode and a high frequency power for ion attraction is applied to a lower electrode. In addition to a capacitively coupled plasma etching apparatus, it is possible to use, e.g., an inductively coupled plasma etching apparatus, which has an antenna arranged on an upper surface of a chamber or around the chamber and generates a plasma by an induced electromagnetic field, and a microwave plasma etching apparatus, which generates a plasma by using a microwave power.

What is claimed is:

1. A dry etching method comprising:
   mounting a silicon substrate on an electrode arranged in a processing chamber;
   generating a plasma by discharging an etching gas in the processing chamber;
   supplying to the electrode a radio frequency power for attracting ions from the plasma; and
   etching the silicon substrate by the plasma,
   wherein a pressure inside the processing chamber is set as about 1 mTorr to 100 mTorr, and
   wherein the etching is carried out while satisfying the following equation:

$$yS \geq -1.7x+295,$$

where yS is the absolute value of a self-bias voltage (V) generated in the electrode and x is the pressure (mTorr) inside the processing chamber.

2. The method of claim 1, wherein the etching is carried out while satisfying the following equation:

$$yS \geq -1.7x+395,$$

where yS and x have the same meanings defined above.

3. The method of claim 1, wherein the etching is carried out while satisfying the following equation:

$$-1.7x+395.0 \geq yS \geq -1.7x+495,$$

where yS and x have the same meanings defined above.

4. A dry etching method comprising:
   mounting a silicon substrate on an electrode arranged in a processing chamber;
   generating a plasma by discharging an etching gas in the processing chamber;
   supplying to the electrode a radio frequency power for attracting ions from the plasma; and
   etching the silicon substrate by the plasma,
   wherein a pressure inside the processing chamber is set as about 1 mTorr to 100 mTorr, and
   wherein the etching is carried out while satisfying the following equation:

$$yM \geq 2.84*10^{-3}x+0.28,$$

where yM is a power density of the radio frequency power per unit area (watt/cm$^2$) of the electrode and x is the pressure (mTorr) inside the processing chamber, and
   wherein the etching is carried out while satisfying the following equation:

$$yS \geq -1.7x+295,$$

where yS is the absolute value of a self-bias voltage (V) generated in the electrode and x has the same meaning defined above.

5. The method of claim 4, wherein the etching is carried out while satisfying the following equation:

$$yM \geq 2.84*10^{-3}x+0.57,$$

where yM and x have the same meanings defined above.

6. The method of claim 4, wherein the etching is carried out while satisfying the following equation:

$$2.84*10^{-3}x+0.57 \geq yM \geq 2.84*10^{-3}x+0.85,$$

where yM and x have the same meanings defined above.

7. The method of claim 4, wherein the pressure inside the processing chamber is set as about 3 mTorr to 20 mTorr.

8. The method of claim 4, wherein an electron density of the plasma is equal to or greater than about $1*10^{10}$ cm$^{-3}$.

9. The method of claim 4, wherein a three-dimensional element body of a cylindrical or a rectangular parallelepiped shape is formed on a main surface of the silicon substrate by the etching.

10. The method of claim 4, wherein the etching gas includes a halogen gas.

11. The method of claim 10, wherein the halogen gas is a chlorine gas.

12. The method of claim 4, wherein an additional electrode is placed in the processing chamber in parallel with the electrode with a gap therebetween and an additional radio frequency power for discharging the etching gas is supplied to the electrode or the additional electrode.

13. The method of claim 12, wherein the radio frequency power has a frequency of about 2 MHz to 27 MHz, and the additional radio frequency power has a frequency of about 40 MHz to 300 MHz.

14. The method of claim 4, wherein a temperature of the electrode is equal to or greater than about 60° C.

15. The method of claim 14, wherein a temperature of the electrode is equal to or greater than about 80° C.

16. The method of claim 4, wherein the etching is carried out by using an etching mask including an inorganic layer.

17. The method of claim 16, wherein the inorganic layer includes silicon nitride.

* * * * *